United States Patent
Cristoforo et al.

(10) Patent No.: US 9,953,801 B1
(45) Date of Patent: Apr. 24, 2018

(54) TWO-AXIS VARIABLE WIDTH MASS RESOLVING APERTURE WITH FAST ACTING SHUTTER MOTION

(71) Applicant: Axcelis Technologies, Inc., Beverly, MA (US)

(72) Inventors: Michael Paul Cristoforo, Beverly, MA (US); Justin White McCabe, Salem, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/363,728

(22) Filed: Nov. 29, 2016

(51) Int. Cl.
  *H01J 37/05* (2006.01)
  *H01J 37/317* (2006.01)
  *H01J 37/08* (2006.01)

(52) U.S. Cl.
  CPC .............. *H01J 37/05* (2013.01); *H01J 37/08* (2013.01); *H01J 37/3171* (2013.01); *H01J 2237/057* (2013.01); *H01J 2237/24585* (2013.01); *H01J 2237/31701* (2013.01)

(58) Field of Classification Search
  CPC ........ H01J 37/05; H01J 37/3171; H01J 37/08; H01J 2237/057; H01J 2237/31701; H01J 2237/24585
  See application file for complete search history.

(56) References Cited

U.S. PATENT DOCUMENTS

| | | | |
|---|---|---|---|
| 5,130,552 A | 7/1992 | Bright et al. | |
| 5,485,008 A * | 1/1996 | Taylor, Jr. | H01J 37/28 250/307 |
| 6,194,734 B1 | 2/2001 | Loomis et al. | |
| 6,207,964 B1 | 3/2001 | McIntyre et al. | |
| 7,399,980 B2 | 7/2008 | Vanderberg et al. | |
| 8,669,517 B2 | 3/2014 | Hamby et al. | |
| 9,281,162 B2 | 3/2016 | White et al. | |
| 2015/0170876 A1* | 6/2015 | Janssen | H01J 37/28 250/307 |
| 2016/0086762 A1* | 3/2016 | de Jong | H01J 37/05 250/305 |

\* cited by examiner

*Primary Examiner* — Jason McCormack
*Assistant Examiner* — Sean Luck
(74) *Attorney, Agent, or Firm* — Eschweiler & Potashnik, LLC

(57) ABSTRACT

A resolving aperture assembly for an ion implantation system has a first plate and a second plate, where the first plate and second plate generally define a resolving aperture therebetween. A position of the first plate with respect to the second plate generally defines a width of the resolving aperture. One or more actuators are operably coupled to one or more of the first plate and second plate and are configured to selectively vary the position the first plate and second plate with respect to one another, thus selectively varying the width of the resolving aperture. A servo motor precisely varies the resolving aperture width and a pneumatic cylinder independently selectively closes the resolving aperture. A downstream position actuator varies a position of the resolving aperture along a path of the ion beam, and a controller controls the one or more actuators based on desired properties of the ion beam.

17 Claims, 2 Drawing Sheets

TWO-AXIS VARIABLE WIDTH MASS RESOLVING APERTURE WITH FAST ACTING SHUTTER MOTION

FIELD OF THE INVENTION

The present invention relates generally to ion implantation systems, and more specifically to systems and methods for controlling an aperture width for ion beams in ion implantation systems.

BACKGROUND OF THE INVENTION

In the manufacture of semiconductor devices, ion implantation is used to dope semiconductors with impurities or dopants. Ion implantation systems (also called ion implanters) are commonly used to treat semiconductor workpieces, such as silicon wafers, with an ion beam in order to produce n or p type extrinsic material doping or to form passivation layers during fabrication of an integrated circuit. When used for doping semiconductors, the ion implanter injects a selected extrinsic ion species to produce the desired properties in the semiconducting material. Implanting ions generated from source materials such as antimony, arsenic or phosphorus results in "n type" extrinsic material wafers, whereas if "p type" extrinsic material wafers are desired, ions generated with source materials such as boron, or indium may be implanted.

Typical ion beam implanters include an ion source for generating positively charged ions from ionizable source materials. The generated ions are formed into a beam and directed along a predetermined beam path toward an end station. The ion beam implanter may include beam forming and shaping structures extending between the ion source and the end station. The beam forming and shaping structures maintain the ion beam and bound an elongated interior cavity or passageway through which the beam passes en route to the end station. When operating an ion implanter, this passageway can be evacuated to reduce the probability of ions being deflected from the predetermined beam path as a result of collisions with gas molecules.

Trajectories of charged particles of given kinetic energy in a magnetic field will differ for different masses (or charge-to-mass ratios) of these particles. Therefore, the part of an extracted ion beam that reaches a desired area of a semiconductor wafer or other target after passing through a constant magnetic field can be made pure, since ions of undesirable molecular weight will be deflected to positions away from the ion beam, whereby implantation of materials other than those desired can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that effectively separates ions of different charge-to-mass ratios.

For some ion implantation systems, the physical size of the ion beam is smaller than a target workpiece, whereby the ion beam is scanned in one or more directions in order to adequately cover a surface of the target workpiece. Generally, an electrostatic or magnetic based scanner scans the ion beam in a fast direction and a mechanical device moves the target workpiece in a slow scan direction in order to provide sufficient coverage of the ion beam across the surface of the target workpiece.

SUMMARY OF THE INVENTION

The present disclosure thus provides a system and apparatus for selectively controlling a width of a mass resolving aperture in an ion implantation system and for selectively blocking the ion beam. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Aspects of the present invention facilitate ion implantation by performing angle adjustments without additional components being added to ion implantation systems. The aspects employ a mass analyzer to perform selected angle adjustments during ion implantation instead of employing separate and/or additional components.

In accordance with one aspect of the invention, an ion implantation system employs a mass analyzer for both mass analysis and angle correction. An ion source generates an ion beam along a beam path. A mass analyzer is located downstream of the ion source that performs mass analysis and angle correction on the ion beam. A resolving aperture assembly is located downstream of the mass analyzer component and along the beam path. The resolving aperture assembly comprises a first plate and a second plate, wherein the first plate and second plate generally define a resolving aperture therebetween. A position of the first plate with respect to the second plate generally defines a width of the resolving aperture.

One or more actuators are further operably coupled to one or more of the first plate and second plate, wherein the one or more actuators are configured to selectively vary the position the respective one or more of the first plate and second plate with respect to one another, therein selectively varying the width of the resolving aperture. A controller is further configured to control the width of the resolving aperture via a control of the one or more actuators, wherein the control of the width of the resolving aperture is based, at least in part, on one or more desired properties of the ion beam.

According to one example, the one or more actuators are further configured to selectively position the first plate and second plate to selectively position the resolving aperture in an exit beam path of the mass analyzer based on one or more of the selected beam envelope and selected mass resolution. The one or more actuators, for example, are further configured to selectively position the first plate with respect to the second plate to selectively close or shutter the resolving aperture, therein selectively preventing the ion beam from traveling downstream of the resolving aperture assembly. In one example, the one or more linear actuators comprise one or more servo motors and one or more pneumatic cylinders operably coupled to one or more of the first plate and second plate, wherein the one or more servo motors are configured to precisely vary the width of the resolving aperture, and wherein the one or more pneumatic cylinders are configured to selectively close the resolving aperture.

In accordance with another example, a sensing apparatus is configured to detect one or more conditions associated with the ion beam. The one or more conditions, for example, may be associated with a beam current and/or one or more fault conditions, and wherein the controller is configured to selectively close the resolving aperture via a control of the pneumatic cylinder upon the detection of the one or more fault conditions. The controller, for example, is further configured to selectively individually translate the first plate and second plate via a control of the one or more actuators based on the one or more conditions sensed by the sensing apparatus.

In another example, a downstream position actuator is configured to selectively vary a position of the resolving aperture along a path of the ion beam, wherein the controller is further configured to control the position of the resolving aperture along the ion beam path based, at least in part, on one or more desired properties of the ion beam. Other systems and methods are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
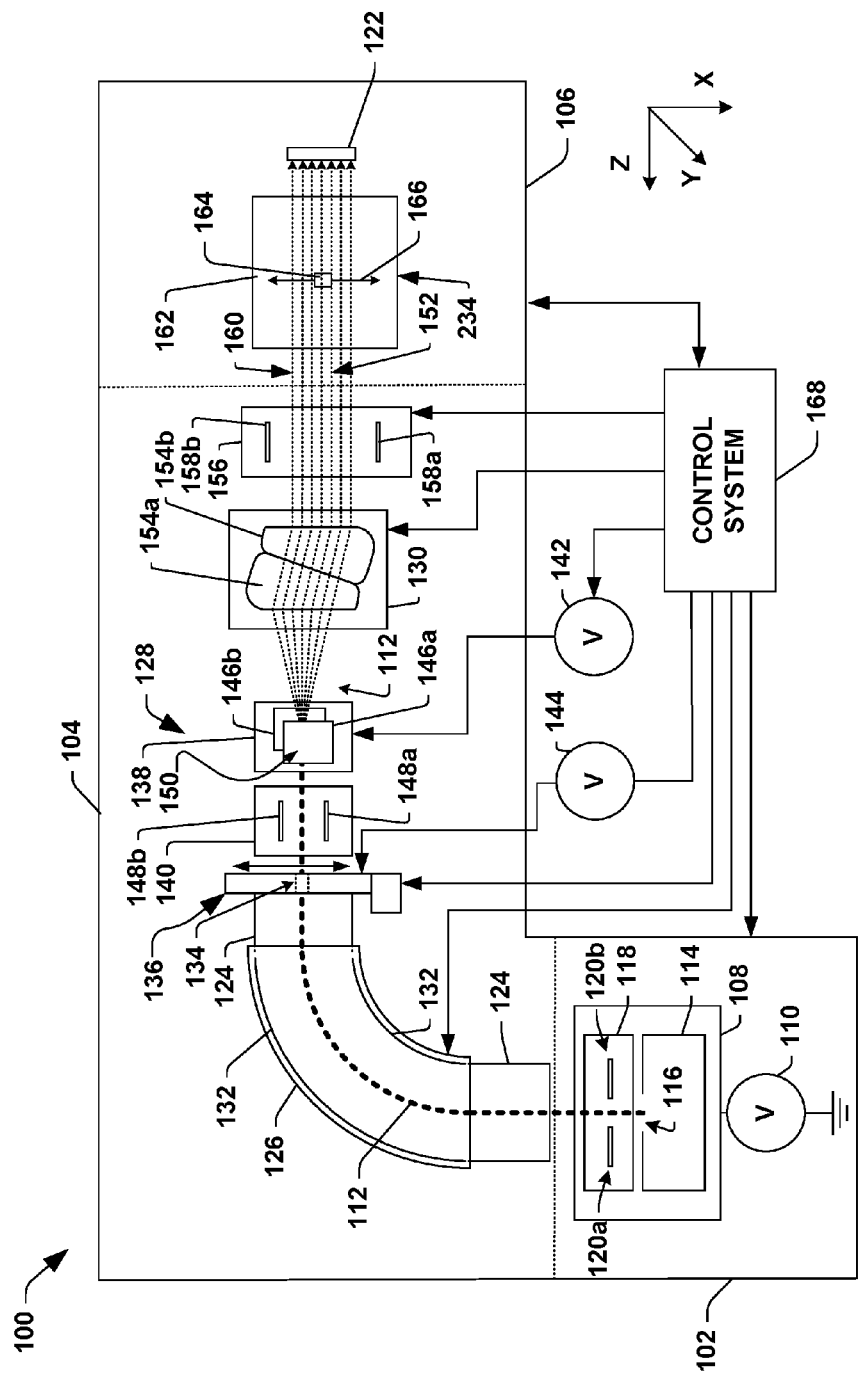
FIG. 1 illustrates an example ion implantation system in accordance with an aspect of the present disclosure.

The present disclosure is directed generally toward a system, apparatus, and method for selectively controlling a width of a mass resolving aperture in an ion implantation system. Accordingly, the present invention will now be described with reference to the drawings, wherein like reference numerals may be used to refer to like elements throughout. It will be understood that the description provided herein is merely illustrative and that this detailed description should not be interpreted in a limiting sense. In the following description, for purposes of explanation, numerous specific details are set forth in order to provide a thorough understanding of the present invention. It will be evident to one skilled in the art, however, that the present invention may be practiced without certain of these specific details. Further, the scope of the invention is not intended to be limited by the embodiments or examples described hereinafter with reference to the accompanying drawings, but is intended to be only limited by the appended claims and substantial equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented via wireless communication, unless noted to the contrary.

The present disclosure provides mass resolving aperture assembly configured to provide a variable width of the mass resolving aperture, while incorporating an ion beam shutter into mass resolving aperture assembly. Accordingly, plates defining the mass resolving aperture are configured to translate along multiple axes (e.g., both the x-axis and z-axis) of a beamline of an ion implantation system. Thus, the mass resolving aperture assembly of the present disclosure is configured to selectively reduce unwanted isotopes in a specific region of an ion beam where the unwanted isotopes are present via an articulation of plates along the multiple axes. Further, the mass resolving aperture assembly is configured to block or shutter the ion beam via the articulation of the plates. Still further, the mass resolving aperture assembly is configured to obtain an ion beam profile at various points along the z-axis by selectively translating or scanning the plates in the x-axis and recording a resulting ion beam current measurement associated therewith.

In accordance with one aspect of the present disclosure, FIG. 1 illustrates an example ion implantation system 100. The system 100 is presented for context and illustrative purposes, and it is appreciated that aspects of the invention are not limited to the described ion implantation system and that other suitable ion implantation systems of varied configurations can also be employed.

The system 100 has a terminal 102, a beamline assembly 104, and an end station 106. The terminal 102 includes an ion source 108 powered by a high voltage power supply 110 that produces and directs an ion beam 112 having a selected species to the beamline assembly 104. The ion source 108 generates charged ions that are extracted and formed into the ion beam 112, which is directed along a beam path in the beamline assembly 104 to the end station 106.

To generate the ions, a gas of a dopant material (not shown) to be ionized is located within a generation chamber 114 of the ion source 108. The dopant gas can, for example, be fed into the generation chamber 114 from a gas source (not shown). In addition to power supply 110, it will be appreciated that any number of suitable mechanisms (none of which are shown) can be used to excite free electrons within the ion generation chamber 114, such as RF or microwave excitation sources, electron beam injection sources, electromagnetic sources and/or a cathode which creates an arc discharge within the chamber, for example. The excited electrons collide with the dopant gas molecules and ions are generated thereby. Typically, positive ions are generated although the disclosure herein is applicable to systems wherein negative ions are generated as well.

The ions are controllably extracted through a slit 116 in the generation chamber 114 by an ion extraction assembly 118, in this example. The ion extraction assembly 118 comprises a plurality of extraction and/or suppression electrodes 120$a$, 120$b$. The ion extraction assembly 118 can include, for example, a separate extraction power supply (not shown) to bias the extraction and/or suppression electrodes 120$a$, 120$b$ to accelerate the ions from the generation chamber 114. It can be appreciated that since the ion beam 112 comprises like charged particles, the beam may have a tendency to blow up or expand radially outwardly as the like charged particles repel one another. It can also be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles, but little particle momentum to keep the particles moving in the direction of the beam path. Accordingly, the extraction assembly 118 is generally configured so that the beam is extracted at a high energy so that the beam does not blow up (e.g., so that the particles have sufficient momentum to overcome repulsive forces that can lead to beam blow up). Moreover, the beam 112, in this example, is generally transferred at a relatively high energy throughout the system 100 and is reduced just before a workpiece 122 positioned in the end station 106 to promote beam containment.

The beamline assembly 104 in the present example has a beamguide 124, a mass analyzer 126, a scanning system 128, and a parallelizer and/or corrector component 130 (referred to generally as a parallelizer). The mass analyzer 126 performs mass analysis and angle correction/adjustment on the ion beam 112. The mass analyzer 126, in this example, is formed at about a ninety degree angle and comprises one or more magnets (not shown) that serve to establish a (dipole) magnetic field therein. As the beam 112 enters the mass analyzer 124, it is correspondingly bent by the magnetic field such that ions of an inappropriate charge-to-mass ratio are rejected. More particularly, ions having too great or too small a charge-to-mass ratio are deflected into side walls 132 of the mass analyzer 126. In this manner, the mass analyzer 126 mainly allows those ions in the beam 112 which have the desired charge-to-mass ratio to pass therethrough and exit through a resolving aperture 134 of a mass resolving aperture assembly 136, details of which will be discussed further infra.

The mass analyzer 126 can perform angle corrections on the ion beam 112 by controlling or adjusting an amplitude of the magnetic dipole field. This adjustment of the magnetic field causes selected ions having the desired/selected charge-to-mass ratio to travel along a different or altered path. As a result, the resolving aperture 134 can be adjusted according to the altered path. In one example, the mass resolving aperture assembly 136 is movable about an x direction (e.g., a direction transverse to the ion beam 112) so as to accommodate altered paths through the resolving aperture 134.

It will be appreciated that collisions of the ion beam 112 with other particles in the system 100 can degrade beam integrity. Accordingly, one or more pumps (not shown) may be included to evacuate, at least, the beamguide 124 and mass analyzer 126.

The scanning system 128 in the illustrated example includes a magnetic scanning element 138 and a focusing and/or steering element 140. Respective power supplies 142, 144 are operatively coupled to the scanning element 138 and the focusing and steering element 140, and more particularly to respective electromagnet pieces 146a, 146b and electrodes 148a, 148b located therein. The focusing and steering element 140 receives the mass analyzed ion beam 112 having a relatively narrow profile (e.g., a "pencil" beam in the illustrated system 100). A voltage applied by the power supply 144 to the plates 148a and 148b operates to focus and steer the beam to a scan vertex 150 of the scanning element 138. A voltage waveform applied by the power supply 142 (which theoretically could be the same supply as 144) to the electromagnets 146a and 146b then scans the beam 112 back and forth, in this example, therein defining a scanned ion beam 152 (sometimes called a "ribbon beam"). It will be appreciated that the scan vertex 150 can be defined as the point in the optical path from which each beamlet or scanned part of the ion beam 112 appears to originate after having been scanned by the scanning element 138.

The scanned beam 112 is then passed through the parallelizer/corrector 130, which comprises two dipole magnets 154a, 154b in the illustrated example. The two dipole magnets 154a, 154b, for example, are substantially trapezoidal and are oriented to mirror one another to cause the beam 112 to bend into a substantially s-shape. Stated another way, the two dipole magnets 154a, 154b have equal angles and radii and opposite directions of curvature.

The parallelizer 130 causes the scanned beam 112 to alter its path such that the ion beam travels parallel to a beam axis regardless of the scan angle. As a result, the implantation angle is relatively uniform across the workpiece 122.

One or more deceleration stages 156 are located downstream of the parallelizer 130 in this example. Up to this point in the system 100, the ion beam 112 is generally transported at a relatively high energy level to mitigate the propensity for beam blow up, which can be particularly high where beam density is elevated such as at scan vertex 150, for example. The one or more deceleration stages 156, for example, comprise one or more electrodes 158a, 158b operable to decelerate the beam 112. The one or more electrodes 158a, 158b are typically apertures thru which the ion beam 112 travels, and may be drawn as straight lines in FIG. 1.

Nevertheless, it will be appreciated that while two electrodes 120a and 120b, 146a and 146b, 148a and 148b and 158a and 158b are respectively illustrated in the exemplary ion extraction assembly 118, scanning element 138, focusing and steering element 140 and deceleration stage 156, these elements may respectively comprise any suitable number of electrodes arranged and biased to accelerate and/or decelerate ions, as well as to focus, bend, deflect, converge, diverge, scan, parallelize and/or decontaminate the ion beam 112 such as provided in U.S. Pat. No. 6,777,696 to Rathmell et al. the entirety of which is hereby incorporated herein by reference. Additionally, the focusing and steering element 140 may comprise electrostatic deflection plates (e.g., one or more pairs thereof), as well as an Einzel lens, quadrupoles and/or other focusing elements to focus the ion beam.

The end station 106 then receives the ion beam 112 which is directed toward the workpiece 122. It is appreciated that different types of end stations 106 may be employed in the implanter 100. For example, a "batch" type end station can simultaneously support multiple workpieces 122 on a rotating support structure, wherein the workpieces are rotated through a beam path 160 (also called a beamline) of the ion beam 112 until all the workpieces are completely implanted. A "serial" type end station, on the other hand, supports a single workpiece 122 along the beam path 160 for implantation, wherein multiple workpieces are implanted one at a time in serial fashion, with each workpiece being completely implanted before implantation of the next workpiece begins. In hybrid systems, the workpiece 122 may be mechanically translated in a first direction (the y-direction or so-called "slow scan" direction) while the ion beam 112 is scanned in a second direction (the x-direction or so-called "fast scan" direction) to impart the beam 112 over the entire workpiece 122.

The end station 106 in the illustrated example is a "serial" type end station that supports the single workpiece 122 along the beam path 160 for implantation. A dosimetry system 162, for example, is included in the end station 106 near the location of the workpiece 122 for measurements of the ion beam 112 (e.g., measurements may be performed prior to implantation operations). During calibration, the beam 112 passes through dosimetry system 162. The dosimetry system 162, for example, includes one or more profilers 164 that may continuously traverse a profiler path 166, thereby measuring the profile of the scanned ion beam 152.

The one or more profilers 164, for example, may comprise a current density sensor, such as a Faraday cup, that measures the current density of the scanned ion beam 152, where current density is a function of the angle of implantation (e.g., the relative orientation between the ion beam and the mechanical surface of the workpiece 122 and/or the relative orientation between the ion beam and the crystalline lattice structure of the workpiece). The current density sensor, for example, moves in a generally orthogonal fashion relative to the scanned ion beam 152 and thus typically traverses the width of the scabbed ion beam. The dosimetry system 162, in one example, measures both beam density distribution and angular distribution.

A control system 168 (also called a controller) is further provided to control, communicate with, and/or adjust the ion source 108, the mass analyzer 132, the mass resolving aperture assembly 136, the magnetic scanner 138, the parallelizer 130, and the dosimetry system 162. The control system 168 may comprise a computer, microprocessor, etc., and may be operable to take measurement values of characteristics of the ion beam 112 and adjust parameters accordingly. The control system 168 can be coupled to the terminal 102 from which the ion beam 112 is generated, as well as the mass analyzer 126 of the beamline assembly 104, the scanning element 138 (e.g., via power supply 142), the focusing and steering element 140 (e.g., via power supply 144), and the deceleration stage 154. Accordingly, any of these elements can be adjusted by the control system 168 to facilitate desired ion implantation. For example, the energy level of the ion beam 112 can be adapted to adjust junction depths by adjusting the bias applied to electrodes in the ion extraction assembly 118 and the deceleration stage 154, for example.

In accordance with one exemplary aspect, the dosimetry system 162, for example, may be utilized to shutter the beam 122 during an implant if the measured beam current is outside a tolerance range that set in process recipe for the particular ion implantation. For example, in a process recipe specifying a desired beam current of 20 ma with a predetermined range of +−10%, the control system 168 may be configured to close the resolving aperture assembly 136 to shutter and hold the implant, should the measured beam current fall below 18 ma or exceed 22 ma. An additional measurement system (not shown, but similar to the dosimetry system 162) may be further used in conjunction with dosimetry system 162 in order to detect fast transients or glitches in the beam 122 that would otherwise go undetected by the dosimetry system 162. During a glitch, for example, the beam 122 is switched off, the resolving aperture assembly 136 will close or shutter, and the implant will be kept on hold until the ion beam is stable. For example, U.S. Pat. No. 7,507,977 to Weiguo, et al. describe a system and method of controlling an ion beam in response to an ion beam glitch.

The strength and orientation of magnetic field(s) generated in the mass analyzer 126 can be adjusted, such as by regulating the amount of electrical current running through field windings therein to alter the charge to mass ratio of the beam, for example. The angle of implantation can be controlled by adjusting the strength or amplitude of the magnetic field(s) generated in the mass analyzer 126 in coordination with the mass resolving aperture assembly 136. The control system 168 can adjust the magnetic field(s) of the mass analyzer 126 and position of the resolving aperture 134 according to measurement data from, in this example, the profiler 164. The control system 168 can verify the adjustments via additional measurement data and perform additional adjustments via the mass analyzer 126 and the resolving aperture 134, if necessary.

In accordance with another aspect, the resolving aperture assembly 136 of the present disclosure provides a fast-acting shutter motion for the resolving aperture 134, wherein the width of the resolving aperture is further variable. Thus, the resolving aperture assembly 136 of the present disclosure is operable to control not only the width and position of the resolving aperture 134 with respect to the mass analyzer, but is further operable to shutter or block the ion beam 112 from traveling further downstream toward the end station 106.

Conventionally, two distinctly separate assemblies were provided to accomplish the shuttering of the ion beam and control of the width of the resolving aperture; namely, a rotatable shutter similar to a ball valve, and a resolving plate having one or more fixed-width apertures, whereby the desired aperture is generally positioned in the center of the beamline. An example of a multiple-aperture plate is provided in commonly owned U.S. Pat. No. 7,399,980 to Vanderberg et al., the contents of which are incorporated by reference in its entirety, herein. Such a multiple-aperture plate provides several discrete widths of resolving apertures, while further providing an ability to move the resolving aperture transverse to the ion beam in order to modify or correct angular orientations of the ion beam. However, additional, separate blocking mechanisms would be conventionally provided in the Vanderberg et al. system in order to block the ion beam in various circumstances, such as during workpiece placement, faults detected in the ion beam, etc.

In accordance with several aspects of the present disclosure, the single resolving aperture assembly 136 is configured to provide a selective variation of the width of the resolving aperture 134, to selectively vary the relative location of the resolving aperture across (e.g., transverse in the x-direction) and along (e.g., in the z-direction) the beamline 160, and to further selectively shutter or block the ion beam 112 from being transported beyond the resolving aperture assembly. Unlike the conventional resolving aperture assemblies having a fixed aperture width, the resolving aperture assembly 136 of the present disclosure provides the resolving aperture 134 with a continuously variable width. The resolving aperture 134 of the present disclosure can be further advantageously translated or swept transverse to the beamline 160, such that the resolving aperture can be positioned to profile the ion beam 112 at various locations across the width of the ion beam.

Figure 2:
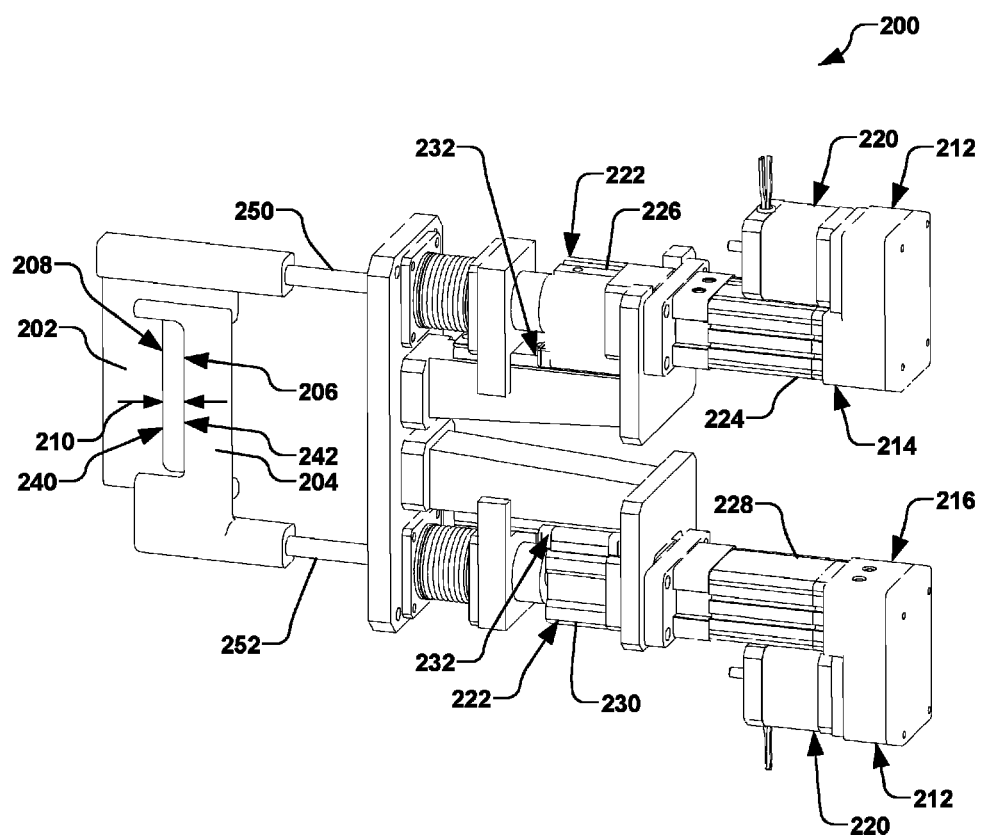
FIG. 2 is a perspective view of an exemplary resolving aperture assembly in accordance with another aspect of the disclosure.

An example of the resolving aperture assembly 136 of FIG. 1 is illustrated in FIG. 2 as exemplary resolving aperture assembly 200, wherein the resolving aperture assembly is positioned downstream of the mass analyzer 126 of FIG. 1. As illustrated in FIG. 2, the resolving aperture assembly 200 comprises a first plate 202 and a second plate 204, wherein the first plate and second plate generally define a resolving aperture 206 therebetween. Accordingly, a position 208 of the first plate 202 with respect to the second plate 204 generally defines a width 210 of the resolving aperture 206, wherein the width of the resolving aperture is selectively variable, as will be discussed further infra.

In accordance with one example, one or more actuators 212 are operably coupled to one or more of the first plate 202 and second plate 204. In the present example, the one or more actuators 212 comprise a first actuator 214 operably coupled to the first plate 202 and a second actuator 216 operably coupled to the second plate 204. The one or more actuators 212 are configured to respectively selectively vary the position 208 of the first plate 202 and second plate 204 with respect to the beamline 160 of FIG. 1 and/or one another. The first plate 202 and second plate 204 of the resolving aperture assembly 200 of FIG. 2, for example, in conjunction with the one or more actuators 212 of the present disclosure, advantageously provides each of the first and second plates to be moved either independently of one another or in unison, thereby selectively varying one or more of the width 210 of the resolving aperture 206, or selectively shifting the beamline position 218 of the resolving aperture from side to side transverse the ion beam 112 of FIG. 1 (e.g., in the x-direction).

In the present example, the first actuator 214 and second actuator 216 of FIG. 2 are configured to selectively translate the respective first plate 202 and second plate 204, either independently, or in unison. Accordingly, the resolving aperture assembly 200 of the present disclosure advantageously allows the ion beam 112 of FIG. 1 to be profiled at almost any location along the width thereof (e.g., in the x-direction), such as in cases when searching for undesirable isotopes associated with the ion beam.

The control system 168, for example, is further configured to control the position 208 of one or more of the first plate 202 and second plate 204 shown in FIG. 2 via a control of the one or more actuators 212. In another example, the first plate 202 and second plate 204 are configured to translate generally parallel to the beamline 160 of the ion beam 112 (e.g., along the z-axis) to accommodate various species of ions utilized in implantation. For example, the waist or smallest part of the ion 112 beam is different for different species (e.g., boron B-11 and B-10 isotopes and arsenic isotopes) as the ion beam exits the mass analyzer 124. For boron B-11 and B-10 isotopes, for example, the waist would be at a certain fixed distance down the beamline 160, whereas for a species such as Arsenic, the waist would be in a different location along the beamline. Thus, the resolving aperture assembly 136 is configured to move the resolving aperture 134 to various positions along the beamline 160 based on the desired species being implanted.

In accordance with one example, the control system 168 of FIG. 1, for example, can be configured to control one or more of the width 210 and position 208 of the resolving aperture 206 of FIG. 2 with respect to the beamline 160, wherein the control of the width of the resolving aperture is based, at least in part, on one or more desired properties of the ion beam 112. The one or more desired properties of the ion beam 112, for example, comprise a selected ion beam envelope (e.g., a desired width of the ion beam) and a selected mass resolution of the ion beam. For example, the one or more actuators 212 of FIG. 2 are configured to selectively position the first plate 202 and second plate 204 to selectively position the resolving aperture 206 in the exit beam path of the mass analyzer 124 based on one or more of the selected beam envelope and selected mass resolution.

In accordance with one example, the one or more actuators 212 of FIG. 2 comprise one or more linear actuators 218. The one or more actuators 218 associated with the resolving aperture assembly 200, for example, are configured to position the first plate 202 with respect to the second plate 204 to selectively close or shutter the resolving aperture 206, therein selectively preventing the ion beam 112 of FIG. 1 from traveling downstream of the resolving aperture assembly. The one or more linear actuators 212 associated with the first plate 202 and second plate 204 of FIG. 2, for example, comprise one or more of a servo motor 220 and a pneumatic cylinder 222 operably coupled to one or more of the first plate and second plate. In the present example, a first servo motor 224 and first pneumatic cylinder 226 are operably coupled to the first plate, and a second servo motor 228 and second pneumatic cylinder 230 are operably coupled to the second plate. The first servo motor 224 and second servo motor 228 are configured to precisely vary the width 210 and position 208 of the resolving aperture along the beamline, while the first pneumatic cylinder 226 and second pneumatic cylinder 230 are configured to quickly close and/or open the resolving aperture 206.

For example, when associated with a recovery from an error associated an ion beam glitch, a location on the workpiece at which the error has occurred on the workpiece is known. Accordingly, in recovering from the error, the implantation is placed in a hold state, and the ion beam is shuttered. The control system is further configured to reposition the workpiece to the known location at which the error occurred, and just as the workpiece arrives at the known location, the resolving aperture 206 is quickly opened via one or more of the first pneumatic cylinder 226 and second pneumatic cylinder 230, whereby the implantation of ions can continue in a generally seamless manner.

The first servo motor 224 and second servo motor 228, for example, are further configured to independently vary the position 208 and width 210 of the aperture 206 by independently positioning the first plate 202 and second plate 204 with respect to one another or the ion beam.

Furthermore, one or more linear potentiometers 232 can be further associated with the one or more linear actuators 212 to provide positional feedback, wherein the one or more linear potentiometers are configured to provide a position of one or more of the first plate 202 and second plate 204 to the controller 168 of FIG. 1. It should be noted that while the one or more linear actuators 212 are described as servo motors and/or pneumatic cylinders, various other types of electric motor-drive actuators, pneumatic actuators, and hydraulic linear actuators are also contemplated as falling within the scope of the present disclosure. Likewise, while one or more linear potentiometers 232 are specifically described, various other feedback mechanisms are contemplated to provide the positional information to the controller. The one or more linear potentiometers 232, for example, can further provide a signal to the control system 168 to indicate an initial reference position associated with the first plate 202 and second plate 204. Once the initial reference position known, the first servo motor 224 and second servo motor 228 can provide respective linear positional information.

In accordance with another exemplary aspect of the disclosure, the dosimetry system 162 of FIG. 1 can be configured as a sensing apparatus 234 to detect one or more conditions associated with the ion beam 112. The one or more conditions, for example, can comprise one or more fault conditions (e.g., an undesirable current of the ion beam 112), and wherein the controller 168 is configured to selectively close the resolving aperture 134 via a control of the one or more pneumatic cylinders 222 of FIG. 2 upon the detection of the one or more fault conditions.

Furthermore, the controller 168 can be configured to selectively individually translate the first plate 202 and second plate 204 of FIG. 2 via a control of the one or more actuators 212 based on the one or more conditions sensed by the sensing apparatus 234, such as an indication from the sensing apparatus that an undesirable isotope is present in the ion beam 112.

Accordingly, the first plate 202 and second plate 204 of the resolving aperture assembly 200 are configured to quickly and selectively shutter or block the ion beam 112 (e.g., in a pinching or scissor-like motion) from any aperture width 210 via the one or more actuators 212, while further advantageously providing the aforementioned independent variation of the position 208 and width 210 of the resolving aperture 206.

Thus, in accordance with the present disclosure, the first plate 202 and second plate 204 of the resolving aperture assembly 200, for example, may be considered as shutters, whereby a first edge 240 and second edge 242 of the respective first plate and second plate are configured to converge toward one another to provide an overlap (not shown). For example, one or more of the first edge 240 and second edge 242 comprise a rabbit feature (not shown), whereby the first plate 202 and second plate 204 overlap each other (e.g., half the overlap distance in the case of both the first plate and second plate having the rabbit feature). For example, for a 6 mm total overlap of the first plate 202 and second plate 204, each rabbit would have a depth of approximately 3 mm. As such, shuttering or entirely blocking of the ion beam 112 of FIG. 1 may be achieved.

In accordance with another example, the first plate 202 and second plate 204 of FIG. 2 are coupled to a respective first shaft 250 and second shaft 252, whereby the one or more actuators 212 are configured to translate the respective first shaft and second shaft. The first plate 202 and second plate 204, for example, are fixedly coupled to the respective first shaft 250 and second shaft 252.

It is further noted that the first plate 202 and second plate 204 are generally exposed to the ion beam 112 of FIG. 1, whereby the first plate and second plate can be heated by the ion beam. Accordingly, the first shaft 250 and second shaft 252 of FIG. 2, for example, can be further cooled, whereby a cooling fluid (e.g., water) passes through a channel (not shown) in the respective first shaft and second shaft. The first shaft 250 and second shaft 252, for example, are comprised of a metal, and the first plate 202 and second plate 204 are comprised of graphite, whereby the metal cools the respective first plate and second plate via thermal conduction therebetween. The first shaft 250 and second shaft 252, for example, can further be operably coupled to a wall of a chamber that generally encloses the beamline assembly 104 via a vacuum feedthrough, whereby circulation of the cooling fluid may be achieved by pumps or other mechanisms in an external environment.

Accordingly, the first plate 202 and second plate 204 are indirectly cooled via the first shaft 250 and second shaft 252. The first shaft 250 and second shaft 252, for example, can pass through respective vacuum feedthroughs, whereby the one or more actuators 212 can also be provided in the external environment.

Thus, the present disclosure provides a resolving aperture assembly 200 having a variable width mass resolving aperture, along with a fast-acting shuttering capability, wherein the mass resolving aperture assembly is further configured to translate the resolving aperture along the beamline.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
    an ion source that generates an ion beam having a selected species;
    a mass analyzer positioned downstream of the ion source that generates a magnetic field according to a selected charge-to-mass ratio and an angle adjustment;
    a resolving aperture assembly positioned downstream of the mass analyzer, the resolving aperture assembly comprising:
        a first plate and a second plate, wherein the first plate and second plate define a resolving aperture therebetween, wherein a position of the first plate with respect to the second plate defines a width of the resolving aperture; and
        one or more actuators operably coupled to one or more of the first plate and second plate, wherein the one or more actuators are configured to selectively vary the position of the respective one or more of the first plate and second plate with respect to one another, therein selectively varying the width of the resolving aperture, and wherein the one or more actuators are further configured to position the first plate with respect to the second plate to selectively close the resolving aperture, therein selectively preventing the ion beam from traveling downstream of the resolving aperture assembly, wherein the one or more actuators comprise a servo motor and a pneumatic cylinder operably coupled to one or more of the first plate and second plate, wherein the servo motor is configured to vary the width of the resolving aperture, and wherein the pneumatic cylinder is configured to selectively close the resolving aperture; and
    a controller configured to control the width of the resolving aperture via a control of the one or more actuators, wherein the control of the width of the resolving aperture is based, at least in part, on one or more desired properties of the ion beam.

2. The ion implantation system of claim 1, wherein the one or more desired properties of the ion beam comprise a selected ion beam envelope and a selected mass resolution of the ion beam.

3. The ion implantation system of claim 2, wherein the one or more actuators are further configured to selectively position the first plate and second plate to selectively position the resolving aperture in an exit beam path of the mass analyzer based on one or more of the selected beam envelope and selected mass resolution.

4. The ion implantation system of claim 3, wherein the one or more actuators comprise one or more linear actuators.

5. The ion implantation system of claim 1, further comprising a sensing apparatus configured to detect one or more conditions associated with the ion beam.

6. The ion implantation system of claim 5, wherein the one or more conditions are associated with one or more fault conditions, and wherein the controller is configured to selectively close the resolving aperture via a control of the pneumatic cylinder upon the detection of the one or more fault conditions.

7. The ion implantation system of claim 6, wherein the one or more fault conditions are associated with an undesirable current of the ion beam.

8. The ion implantation system of claim 5, wherein the controller is configured to selectively individually translate the first plate and second plate via a control of the one or more actuators based on the one or more conditions sensed by the sensing apparatus.

9. The ion implantation system of claim 8, wherein the one or more conditions comprise an ion beam current associated with an undesirable isotope.

10. The ion implantation system of claim 1, further comprising a focusing component positioned downstream of the mass analyzer and upstream of the resolving aperture, wherein the focusing component is configured to converge the ion beam.

11. The ion implantation system of claim 10, wherein the focusing component is configured to converge the ion beam to a minimum value at a position proximate to the resolving aperture.

12. The ion implantation system of claim 1, further comprising one or more linear potentiometers, wherein the one or more linear potentiometers are configured to provide a position of one or more of the first plate and second plate to the controller.

13. The ion implantation system of claim 1, wherein the servo motor and pneumatic cylinder are configured to independently vary the position the first plate and second plate with respect to one another.

14. The ion implantation system of claim 1, further comprising a downstream position actuator configured to selectively vary a position of the resolving aperture along a path of the ion beam, wherein the controller is further configured to control the position of the resolving aperture along the path of the ion beam based, at least in part, on one or more desired properties of the ion beam.

15. A resolving aperture assembly for an ion implantation system, the resolving aperture assembly comprising:
   a first plate;
   a second plate; and
   one or more linear actuators operably coupled to one or more of the first plate and second plate, wherein the one or more linear actuators comprise a servo motor and a pneumatic cylinder, wherein the servo motor and pneumatic cylinder are configured to independently vary the position the first plate and second plate with respect to one another, wherein the first plate and second plate define a resolving aperture therebetween, wherein a position of the first plate with respect to the second plate defines a width of the resolving aperture, wherein the resolving aperture is configured to selectively block ions of an ion beam, and wherein the one or more linear actuators are configured to selectively vary the position the first plate and second plate with respect to one another, therein selectively varying the width of the resolving aperture, wherein the servo motor is configured to selectively vary the width of the resolving aperture, and wherein the pneumatic cylinder is configured to selectively close the resolving aperture.

16. The resolving aperture assembly of claim 15, further comprising one or more linear potentiometers wherein the one or more linear potentiometers are configured to determine a position of one or more of the first plate and second plate.

17. The resolving aperture assembly of claim 15, further comprising a controller configured to selectively vary the width of the resolving aperture via a control of the one or more linear actuators.

\* \* \* \* \*